United States Patent
Di Stefano et al.

(10) Patent No.: US 11,245,353 B2
(45) Date of Patent: Feb. 8, 2022

(54) METHOD AND SYSTEM FOR INSTALLING PHOTOVOLTAIC SOLAR PANELS IN AN OUTDOOR AREA

(71) Applicant: Comau S.p.A., Grugliasco (IT)

(72) Inventors: Giovanni Di Stefano, Grugliasco (IT); Francesco Beccarisi, Grugliasco (IT); Egidio De Gese, Grugliasco (IT)

(73) Assignee: Comau S.p.A., Grugliasco (IT)

( * ) Notice: Subject to any disclaimer, the term of this patent is extended or adjusted under 35 U.S.C. 154(b) by 0 days.

(21) Appl. No.: 16/760,668

(22) PCT Filed: Nov. 2, 2018

(86) PCT No.: PCT/IB2018/058621
§ 371 (c)(1),
(2) Date: Apr. 30, 2020

(87) PCT Pub. No.: WO2019/097348
PCT Pub. Date: May 23, 2019

(65) Prior Publication Data
US 2020/0350850 A1 Nov. 5, 2020

(30) Foreign Application Priority Data
Nov. 14, 2017 (IT) .................. 102017000130000

(51) Int. Cl.
*H02S 20/20* (2014.01)
*H02S 20/23* (2014.01)
(Continued)

(52) U.S. Cl.
CPC ............ *H02S 20/20* (2014.12); *B25J 9/1687* (2013.01); *B25J 9/1697* (2013.01); *H02S 20/23* (2014.12);
(Continued)

(58) Field of Classification Search
CPC .......... H02S 30/10; H02S 30/23; H02S 20/20; B25J 9/1687; B25J 9/1697; Y02B 10/10;
(Continued)

(56) References Cited

U.S. PATENT DOCUMENTS 4,954,952 A * 9/1990 Ubhayakar ............ B25J 9/0084
244/172.5
9,352,941 B2 * 5/2016 Wheeler ................. B66C 17/04
(Continued)

FOREIGN PATENT DOCUMENTS

DE 102010038054 A1 3/2012
EP 2263964 A2 12/2010
(Continued)

*Primary Examiner* — Jessie T Fonseca
(74) *Attorney, Agent, or Firm* — Young Basile Hanlon & MacFarlane, P.C.

(57) ABSTRACT

A system for positioning a row of photovoltaic solar panels (1) on a support structure (S) arranged in an outdoor space includes a vehicle (20) on which the photovoltaic solar panels (1) to be installed are arranged, and a manipulator robot (24) arranged on-board the vehicle (20) for sequentially picking-up one or more photovoltaic panels (1) from the vehicle, and for positioning them on said support structure (S) as the vehicle moves on one side along the support structure (S). An optoelectronic system (27) is used for automatic optical recognition of the correct position in which a photovoltaic solar panel (1) must be picked-up as well as the correct installing position of the photovoltaic solar panel (1) on the support structure (S).

20 Claims, 10 Drawing Sheets

(51) Int. Cl.
  *H02S 30/10*   (2014.01)
  *B25J 9/16*    (2006.01)
  *B60P 3/00*    (2006.01)
  *F24S 25/00*   (2018.01)

(52) U.S. Cl.
  CPC ............... *H02S 30/10* (2014.12); *B60P 3/00* (2013.01); *F24S 2025/014* (2018.05); *Y02B 10/10* (2013.01); *Y02E 10/47* (2013.01); *Y02E 10/50* (2013.01)

(58) Field of Classification Search
  CPC .... Y02E 10/50; Y02E 10/47; F24S 2025/014; F24S 25/632; F24S 25/12; F24S 25/20; H01L 31/02; B60P 3/00
  See application file for complete search history.

(56) References Cited

U.S. PATENT DOCUMENTS

| | | | |
|---|---|---|---|
| 9,882,067 B2* | 1/2018 | Britcher | H02S 20/30 |
| 2012/0027550 A1 | 2/2012 | Bellacicco et al. | |
| 2013/0133172 A1 | 5/2013 | Kiener et al. | |
| 2014/0246257 A1* | 9/2014 | Jacobsen | B62D 55/0655 180/14.2 |
| 2017/0137238 A1* | 5/2017 | Kamata | B60P 1/5485 |
| 2019/0134822 A1* | 5/2019 | Clemenzi | H02S 99/00 |
| 2019/0280647 A1* | 9/2019 | Novotny | H02S 40/10 |

FOREIGN PATENT DOCUMENTS

| | | |
|---|---|---|
| WO | 2010145844 A2 | 12/2010 |
| WO | 2012/015451 A2 | 2/2012 |

* cited by examiner

Prior Art

METHOD AND SYSTEM FOR INSTALLING PHOTOVOLTAIC SOLAR PANELS IN AN OUTDOOR AREA

CROSS-REFERENCE TO RELATED APPLICATIONS

The present application is filed pursuant to 35 USC 371 and claims priority benefit to PCT patent application PCT/IB2018/058621 filed Nov. 2, 2018 which claims priority benefit to Italian patent application no. 102017000130000 filed Nov. 14, 2017 the entire contents of both applications incorporated herein by reference.

TECHNICAL FIELD

The present invention relates to a method and a system for positioning photovoltaic solar panels on a support structure arranged in an outdoor space, wherein a vehicle is provided, on board of which the photovoltaic solar panels to be installed are arranged, and in which the vehicle is equipped with a manipulator robot programmed for picking-up one or more photovoltaic panels from the vehicle and for positioning them on said support structure.

BACKGROUND

A method and a system of the type indicated above are known from document WO 2012/015451 A2. In the case of this known solution, the photovoltaic solar panels are mounted on rails forming part of the support structure arranged in the field, and are carried into their final position by causing the support frame of the panels to slide between said rails. The robot operates with the vehicle stationary in a predetermined position, and inserts the frames carrying the panels between the rails, one after the other, and then causing the entire row of frames to slide between the rails. This method is not clearly applicable in an efficient way on a large scale, due to the need to align and slide each support frame of the panels between the rails and due to the difficulty of positioning the panels precisely and safely in a final required position. The known solution envisages that the rails may have portions configured so that the panels can be dropped from above, but in any case after positioning the panels on the rails, the panels must be always caused to slide along the rails until the required end position is reached. This also involves the further drawback of requiring the provision of a support structure having a particular configuration, provided with sliding guides for the panels.

SUMMARY

The object of the present invention is to propose a method and a system for installation of photovoltaic solar panels which makes the installation operation easier, safer and faster compared with the known methods, and which can be adopted for any configuration of the support structure provided on the field.

A further object of the invention is to provide an installation method which can be easily automated and controlled from a remote control station.

A further object of the invention is to provide a method and a system for installing photovoltaic solar panels which ensures a high level of safety against the risk of damage to the photovoltaic solar panels during the installation operation.

In view of achieving one or more of the aforesaid objects, the invention relates to a method for installing at least one photovoltaic solar panel on a support structure, characterized in that:

the vehicle moves on one side, and along, said support structure for successively positioning said row of photovoltaic solar panels, each photovoltaic solar panel being positioned by the manipulator robot on the support structure, with an approaching movement of the photovoltaic solar panel towards the support structure, in such a way that at the end of this movement each photovoltaic solar panel is already in its final position along said row.

Once positioned, each photovoltaic solar panel can be locked in its operating position above the support structure. This operation can be performed manually, for example, by screwing, or with the aid of a coupling device of any type. The coupling device does not form part of the present invention. In the case of automatic coupling, the robot preferably imparts a movement to the panel, substantially from above downwardly and/or substantially perpendicular to the plane of the area designed to receive the panel.

In the present description, and in the claims that follow, the term "support structure" of the photovoltaic solar panel means any structure arranged on the ground designed to receive and support the photovoltaic solar panel. This structure can be formed—in some cases—by the movable part of a tracking device (or "tracker"), of any known type, which is able to orientate the photovoltaic solar panel during the day in such a way as to follow the apparent movement of the sun.

According to a further preferred characteristic, the aforesaid vehicle is an autonomous vehicle, for example an AGV ("Automated Guided Vehicle") mounted on wheels or on tracks.

Still according to a further preferred characteristic, the aforesaid manipulator robot is equipped with an optoelectronic system for automatic optical recognition of the correct position for picking-up a photovoltaic solar panel to be installed, as well as the correct installation position of the photovoltaic solar panel on the support structure.

In this stage, a problem arises in providing the electronic controller of the robot with precise coordinates of a plurality of points that correctly identify the installation position of the photovoltaic solar panel. This problem is not easy to solve, since the support structure on which the photovoltaic solar panels should be mounted generally has a certain degree of flexibility, and tends to deform as it is gradually loaded with a row of photovoltaic solar panels. This causes a change in the position in which the area of the support structure designed to receive a given panel is located, at the moment when the robot brings this panel close to the structure.

In one embodiment, this problem is solved by that the optoelectronic system includes an electronic controller programmed to calculate the correct position for installing each photovoltaic solar panel on a predetermined area of the support structure, on the basis of the optical detection of the position of another photovoltaic panel, previously installed on the support structure adjacent to said predetermined area.

The invention also relates to the system for implementing the above method.

In a preferred embodiment, the aforesaid vehicle is provided with a cover that protects the robot and the photovoltaic solar panels carried by the vehicle, and which protrudes at least on one side of the vehicle to create a protected chamber above the positioning area of each photovoltaic solar panel. Still preferably, the cover has a portion movable between an extracted position, in which it defines said protruding portion of the cover, and a retracted position within the vehicle structure. In its extracted condition, the movable portion of the cover protects the working area from direct sunlight, this area being illuminated with artificial light.

According to a further characteristic, the manipulator robot can be provided with a protective sheath, inside which air can be blown at a controlled temperature.

BRIEF DESCRIPTION OF THE DRAWINGS

Further characteristics and advantages of the invention will become apparent from the description that follows with reference to the attached drawings, provided purely by way of non-limiting example, wherein.

DETAILED DESCRIPTION

Figure 1:
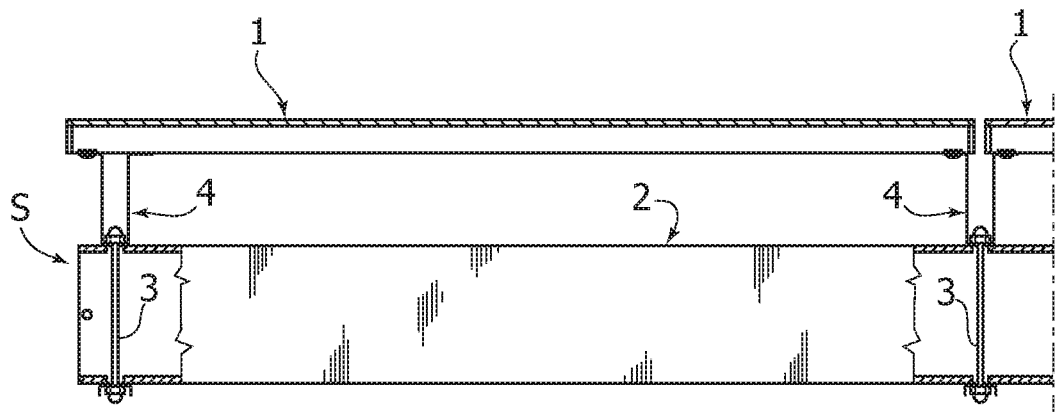
FIG. 1 is a cross-sectional view of a photovoltaic solar panel in the mounted condition on a support structure arranged in an outdoor space, according to a solution of the prior art.
Figure 2:
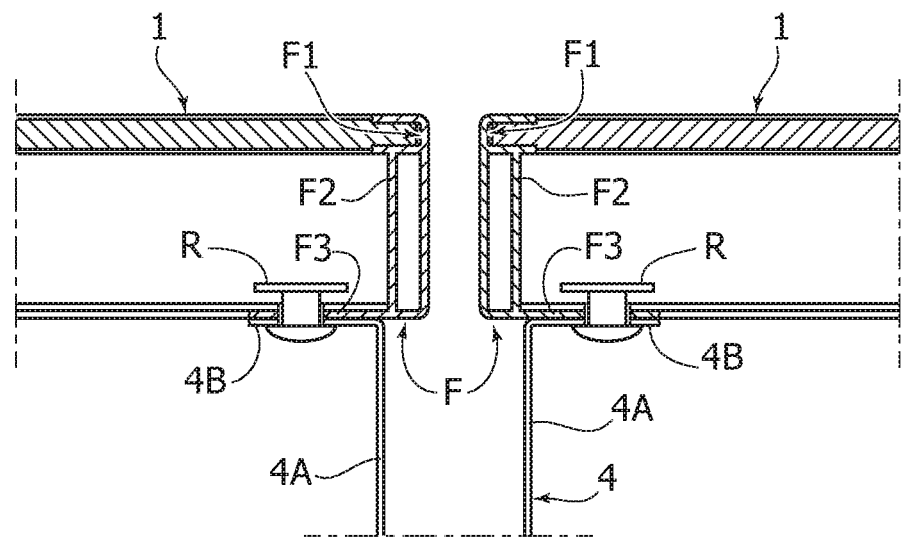
FIG. 2 illustrates an enlarged detail of FIG. 1.

FIGS. 1 and 2 show an example of a connection between several photovoltaic solar panels and a support structure arranged on an outdoor space, according to the prior art.

As already indicated above, in the present description and in the claims that follow, the term "support structure" of the photovoltaic solar panel means any structure arranged for this purpose in an outdoor terrain. Typically, this structure is formed by the movable part of a tracking device ("tracker"), made in any known manner, designed to pivot the photovoltaic solar panels during the day, in order to follow the apparent motion of the sun.

In FIGS. 1 and 2, the reference number 1 indicates two photovoltaic solar panels (one of which is only partially illustrated in FIG. 1), which are part of an array of photovoltaic solar panels arranged in an outdoor space. According to the most common solution, the photovoltaic solar panels are arranged on the respective support structures in several rows parallel to, and spaced apart from, each other.

In the case of the known example illustrated in FIG. 1, the support structure of the photovoltaic solar panels 1, indicated—in its entirety—by S, includes a beam 2, on which profiled bars 4 with a cross-section in the form of an inverted omega are rigidly connected, by means of bolts 3. All the aforesaid elements are made of metal material, for example steel. FIG. 2 shows the upper part of a profiled bar 4. Each profiled bar 4 has two parallel and spaced apart walls 4A, which have their upper longitudinal edges bent at 90° outwards, so as to define two flanges 4B.

Each photovoltaic solar panel 1 has a structure of any known type having a quadrilateral configuration. Along its four sides, each photovoltaic solar panel 1 is carried by a peripheral frame F, for example, of plastic material. However, the present invention does not exclude that the solar panel can be without a frame, in which case the panel itself is coupled with the support structure.

As shown in FIG. 2, the frame F has a cross-section with an upper portion defining a seat F1 for receiving a respective edge of the photovoltaic solar panel 1 and a vertical wall F2 extending downwards from the upper portion. An additional wall F3 extends at the lower end of the vertical wall F2, which is parallel and spaced apart from the photovoltaic solar panel 1 and which acts as a connecting flange to a respective flange 4B of a respective profiled bar 4.

According to the prior art, the frames F of the photovoltaic solar panels 1 are connected to the flanges 4B of the profiled bars 4 by rivets or nails R (see FIG. 2) or, alternatively, by any other connecting means.

Figure 6:
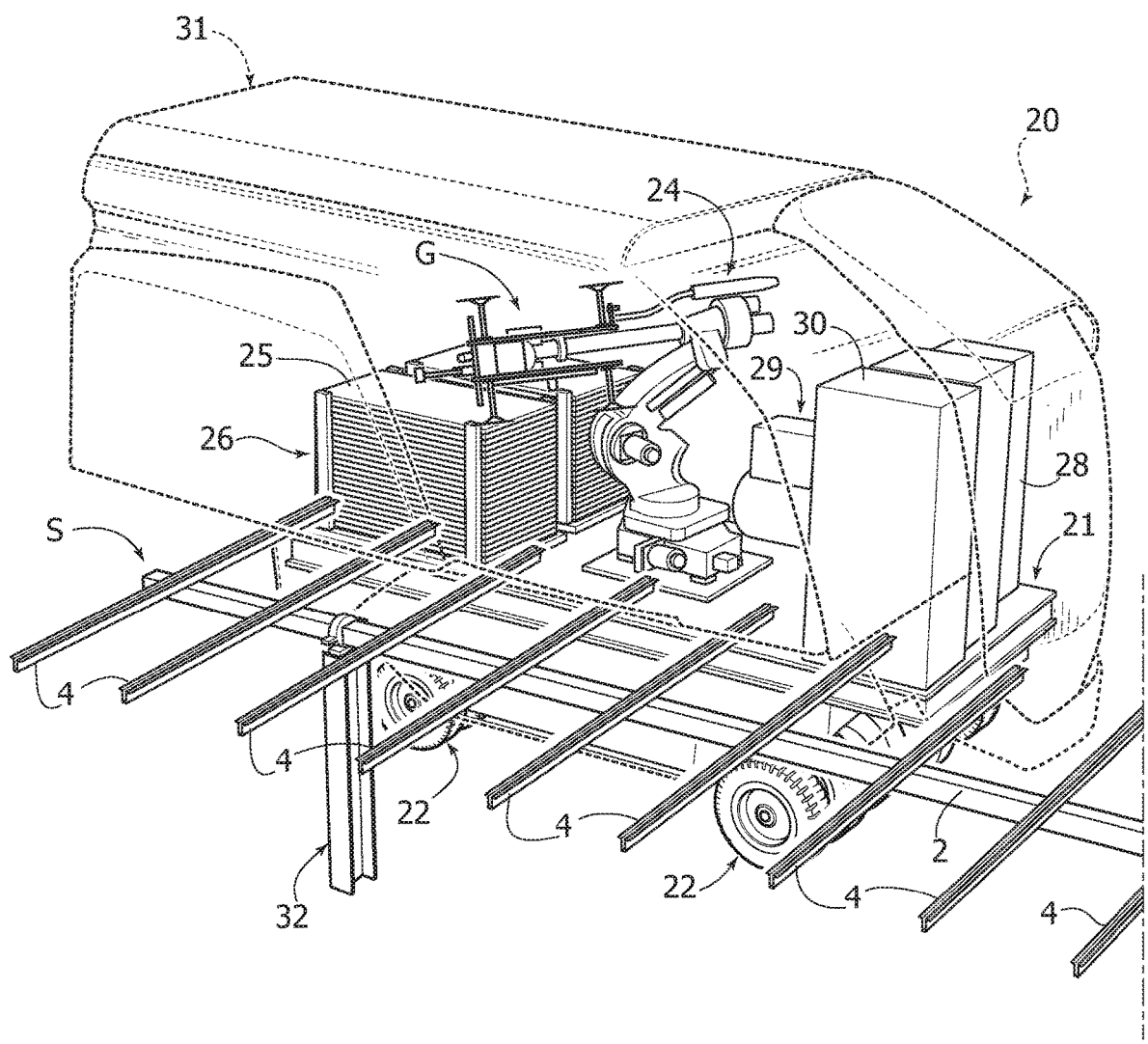

An example of the support structure S, with the beam 2 and the profiled bars 4, is also visible in FIG. 6, which will be illustrated below, relative to an embodiment of the system according to the invention. FIG. 6 also shows that the structure S comprises supporting uprights 32, fitted into the ground (only one of which is visible in the Figure), which carry the beam by means of joining devices, of any known type, including means for pivoting the beam 2 about its longitudinal axis, in order to obtain the solar tracking movement of the photovoltaic solar panels intended to be carried by the structure S.

For the purposes of the implementation of the present invention, the support structure S and the support frame F of each photovoltaic solar panel 1 may, in any case, have any configuration, for example, the same configuration illustrated in FIGS. 1, 2 with reference to the known solution, or any other configuration.

In the present invention, each photovoltaic solar panel 1 is installed by means of a manipulator robot carried by a vehicle, on board of which the photovoltaic solar panels to be installed are arranged. Preferably, the vehicle is an autonomous vehicle, for example an AGV (Automated Guided Vehicle).

An example of a solution of this type is shown in FIGS. 3-11. In these figures, the reference number 20 indicates a vehicle of the AGV type comprising a platform 21 mounted, by means of any known type of suspensions, on front and rear carts with rubber wheels 22. Depending on the configuration and the nature of the ground on which the vehicle must operate, tracks can also be adopted, in place of the wheels, as in the case of the embodiment that will be illustrated below, with reference to FIG. 13. In the case of a vehicle on wheels, at least some wheels are steering wheels, and all or some wheels are powered wheels driven by an electric driving system or an internal combustion system (not illustrated in the drawings). All the details concerning the driving system, the steering system and the electronic control system, which enables the vehicle 20 to be guided from a remote control position, are not described or illustrated herein, since they can be made in any known way and do not fall, taken alone, within the scope of the invention. For example, an internal combustion engine can be provided, which can be used not only as a vehicle driving system, but also for operating an electric generator on the vehicle.

Figure 5:
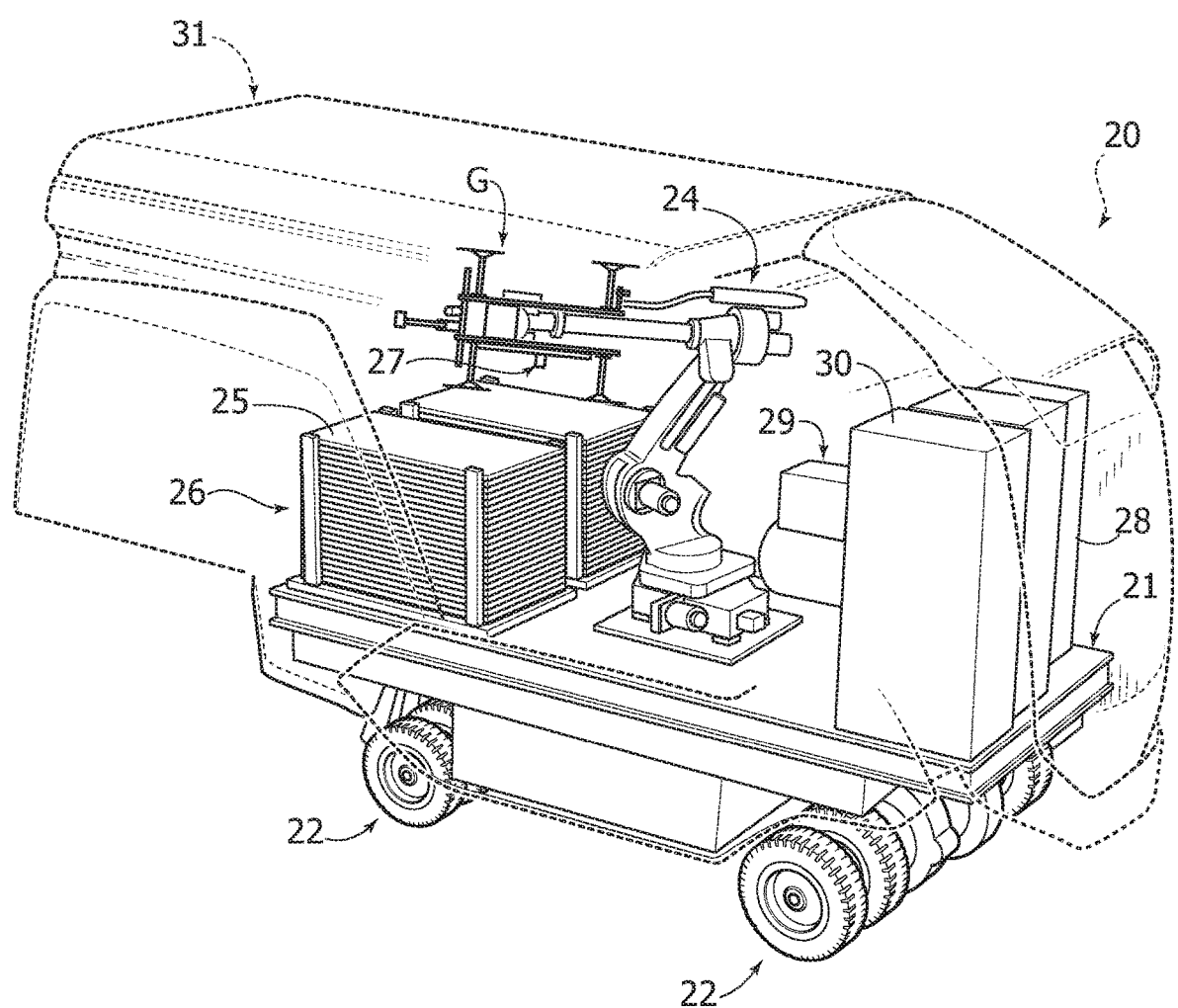
FIGS. 5 and 6 are additional perspective views of the vehicle of FIGS. 3 and 4, with the outer envelope illustrated only in transparency, and in which FIG. 6 also illustrates a portion of the support structure arranged for receiving the photovoltaic solar panels.

Also, with reference in particular to FIGS. 5 and 6, a multi-axis manipulator robot 24 of any known type is mounted above the platform 21, having a base platform anchored to the platform 21, and a chain of robot elements mutually articulated about respective pivoting axes. The chain of robot elements terminates with a robot wrist carrying a gripping device, or gripper, G.

Figure 7:
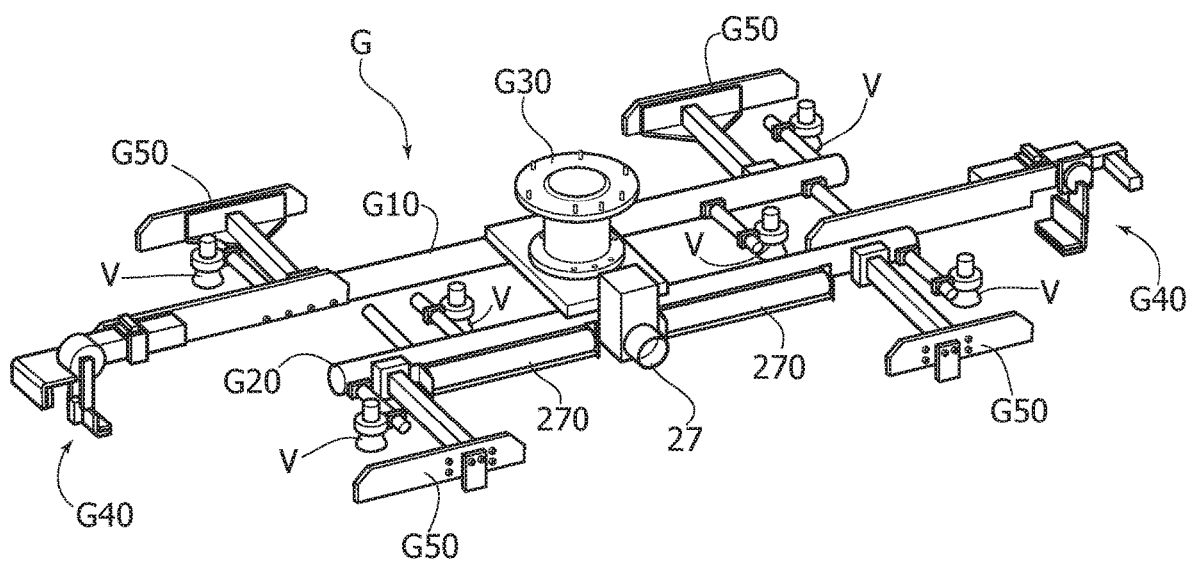
FIG. 7 is a perspective view of a gripping device, or gripper, used by the robot forming part of the system of FIGS. 3-6.

The gripper G may be of any known type, but a preferred embodiment is illustrated in FIG. 7. With reference to this Figure, the gripper G has a frame including two parallel and spaced apart beams G10, G20 connected to each other by a central plate carrying a flange G30 for connecting to a flange carried by the robot wrist 24. According to the prior art, this connection creates both the rigid connection of the gripper G to the robot wrist and the electrical and fluid connections between the robot 24 and gripper G. The beams G10, G20 carry the support arms of suction cups V, which can be activated by vacuum, for grasping the photovoltaic solar panels 1. The two beams G10, G20 also carry two gripping clamps G40, also of any known type, for example of a type which is pneumatically activated, located at opposite ends of the gripper. The gripper also carries four feet G50 for resting on the gripped panel. The beam G20 also carries an optoelectronic device including a video camera 27, of any known type, for guiding the movements of the robot 24. Along the beam G20 are two light sources 270, longitudinally extended, at the two sides of the video camera 27.

Again with reference to FIGS. 5 and 6, an electric generator 28 is provided above the platform 21, driven by the vehicle engine, for supplying the electrical services on board the motor-vehicle and, in particular, the robot 24. Alternatively, or preferably in addition, electrical supply batteries can be provided, which can be recharged by the generator. On the platform 21, a motor-compressor unit 29 is also provided for supplying pressurized air to the pneumatic actuators carried by the robot, as well as to create the vacuum necessary for operating the suction cups V. On the platform 21, the robot controller 30 is also arranged, which is programmed for controlling the robot according to a predetermined operating cycle.

On the platform 21, one or more containers 26 are also provided carrying one or more piles 25 of photovoltaic solar panels 1.

Figure 3:
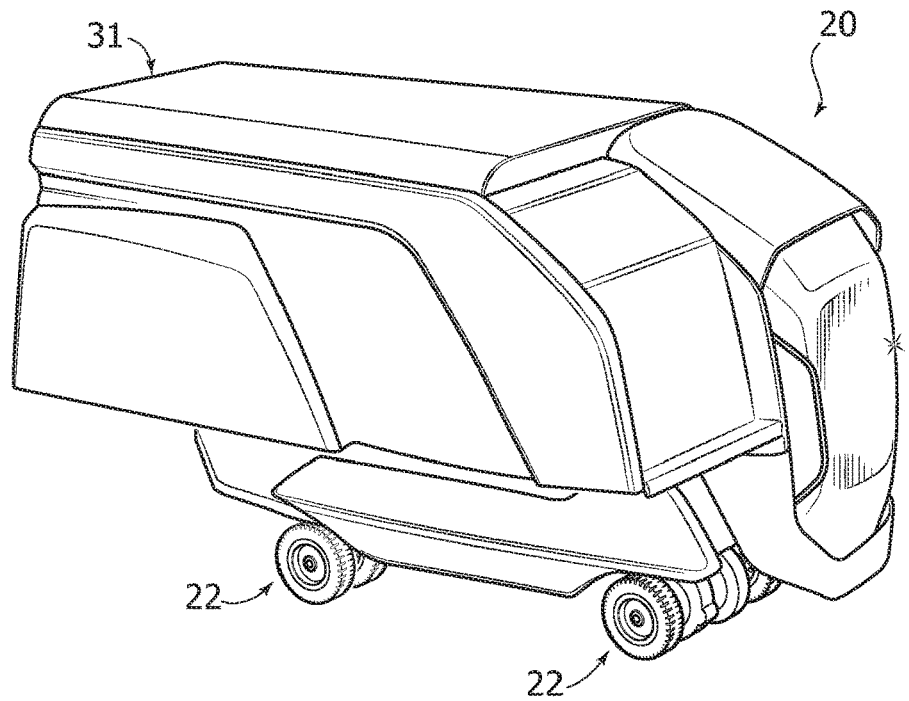
FIGS. 3 and 4 are a perspective view and a side view of an AGV-type vehicle, used in an embodiment of the system according to the invention.
Figure 4:
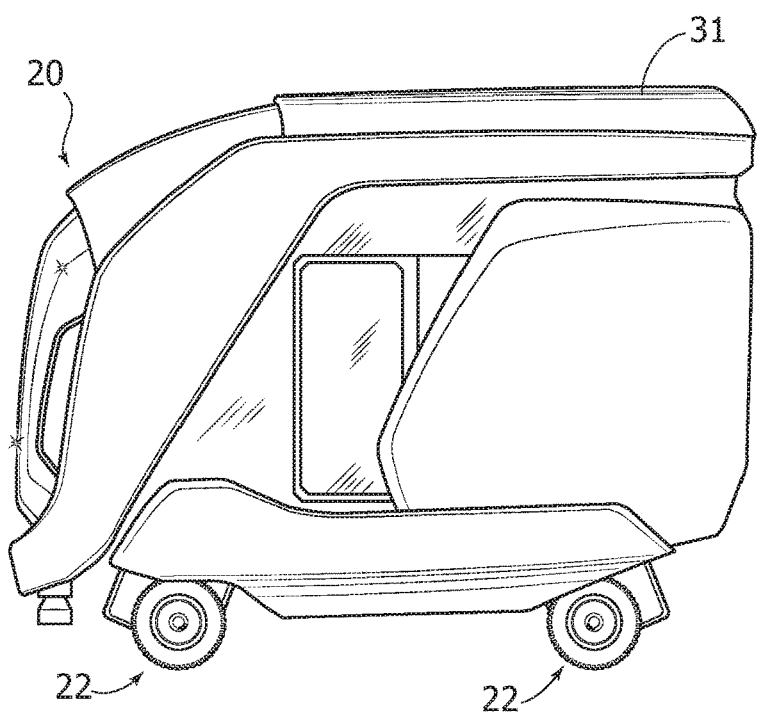

FIGS. 3, 4 show a hood covering 31, provided on the vehicle 20, which protects the robot 24, the photovoltaic solar panels 1 and all the other appliances carried by the vehicle 20, in particular from atmospheric agents, foreign bodies and dust and mud. The hood cover 31 protrudes at least on one side of the vehicle to create a protected chamber above the positioning area of each photovoltaic solar panel, leaving a passage free through which the robot 24 passes the photovoltaic solar panels 1 to install them on the support structure S. Preferably, the hood covering is configured to create an isolated environment within it, with predetermined ambient and/or light conditions.

Figure 12:
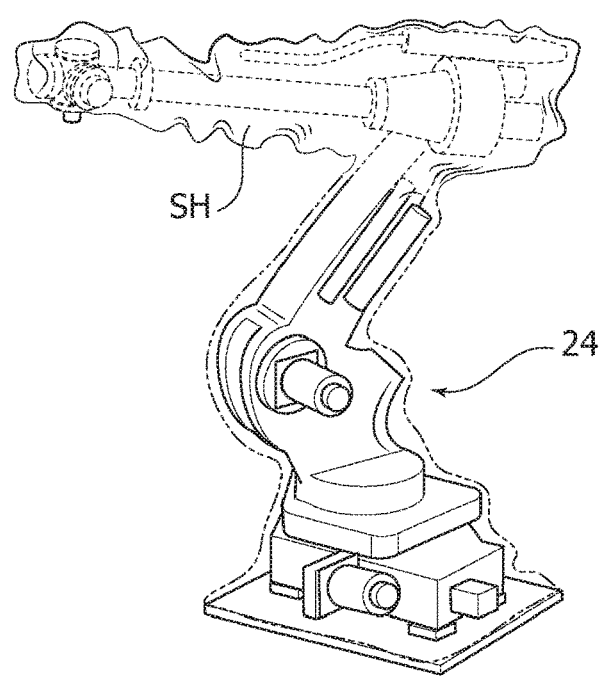
FIG. 12 shows a solution that makes use of a robot equipped with a protective sheath.

According to a further characteristic, the manipulator robot 24 can be provided with a protective sheath SH, inside which air can be blown at a controlled temperature (FIG. 12).

FIG. 6 shows the vehicle 20 in a position adjacent to a support structure S arranged in the field, including the beam 2 carrying the profiled bars 4. FIG. 6 also shows that the beam 2 is mounted on uprights 32 installed in the field, which include a solar tracking device of any known type at their upper ends, configured to rotate the beam 2 about its longitudinal axis, so to allow orientation of the photovoltaic solar panels 1 designed to be carried by the structure S during the apparent motion of the sun.

In a typical configuration, several support structures S are provided, arranged in parallel and spaced apart rows, in such a way that the vehicle 20 can proceed in the corridors between the rows of the structures S. As the vehicle gradually advances, it reaches the position in which each photovoltaic panel, or each frame carrying one or more photovoltaic panels, is to be installed.

Figure 8:
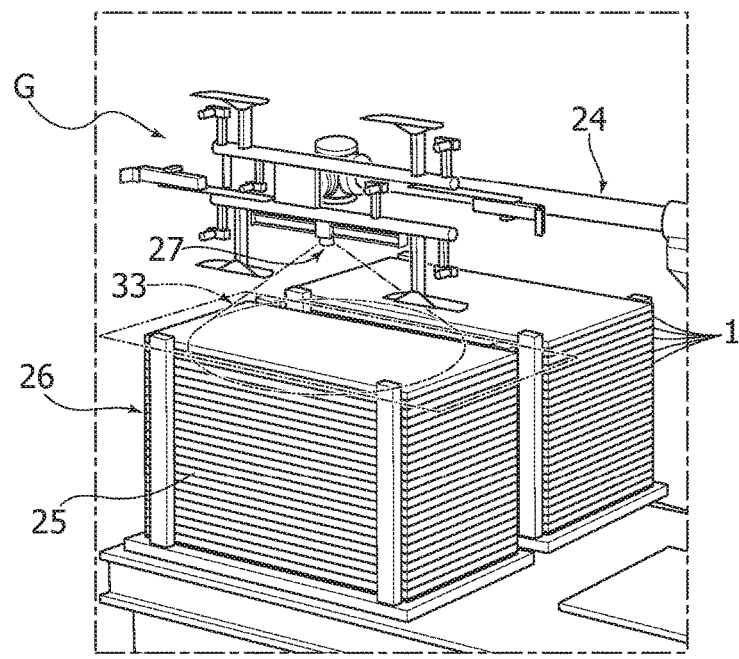
FIGS. 8-11 are perspective views illustrating different steps of the installation method of a photovoltaic solar panel using the installation system illustrated in FIGS. 3-7.
Figure 9:
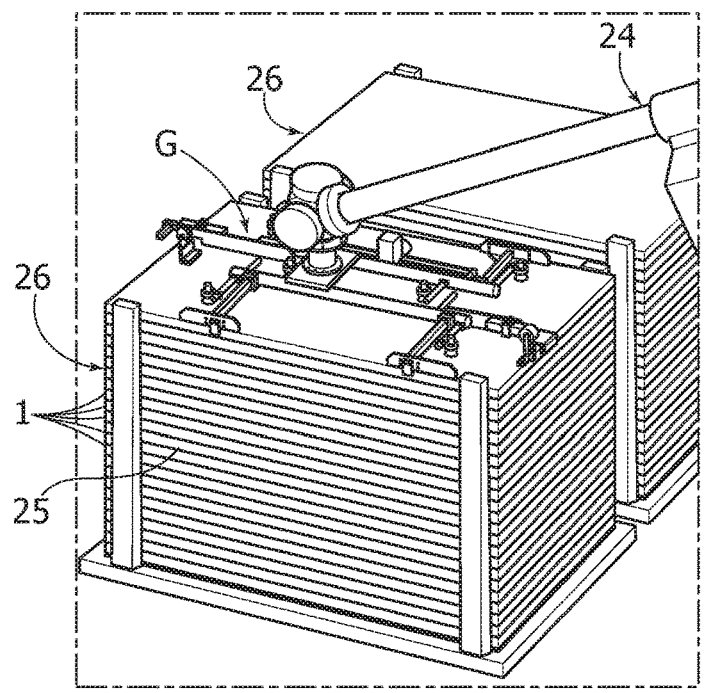

FIGS. 8-11 show the sequence of steps of the installation operation of a photovoltaic solar panel. It is assumed that the vehicle is advanced alongside the support structure S up to the position in which a photovoltaic panel 1 must be installed. In the step illustrated in FIG. 8, the manipulator robot 24 arranges the gripper G in a substantially vertical position, so as to orientate the video camera 27 downwards. In FIG. 8, numeral 33 indicates the optical viewing cone of the video camera 27. The video camera 27 detects the position of a photovoltaic solar panel 1 to be picked-up so as to allow an automatic operation of the robot 24, in order to bring the gripper G into a precise picking-up position of the panel 1, as illustrated in FIG. 9. In the step illustrated in FIG. 9, the suction cups V and the clamps G40 of the gripper G are activated, to allow gripping of the panel by the gripper G. Once the panel 1 has been picked-up, the robot 24 brings the panel above the support structure S. In this step, illustrated in FIG. 10, the robot arranges the gripper with the panel 1 in a substantially vertical position, again in order to allow the video camera 27 to detect the image of the support structure S and to guide the robot in order to position the panel 1 in a precise installation position above the profiled bars 4 of the support structure S (see FIG. 11). In this last step, the robot lowers the panel 1 over the support structure S until the frame F is engaged on the support structure S. Locking the frame F on the structure S can be provided by means of an automatic intervention of a quick-coupling device, or by any other type of coupling. The coupling device does not form part of the present invention.

As is evident from the above description, the method and the system according to the invention dramatically reduce the time required to perform the installation, they guarantee the achievement of a highly precise uniform positioning of the photovoltaic solar panels 1 and they ensure correct locking of the panels in the installed condition.

As the vehicle moves along the corridor next to the support structure S, it is able to mount each photovoltaic panel with an approaching movement of the photovoltaic solar panel towards the support structure, in such a way that at the end of this movement each photovoltaic solar panel is already in its final position along the row of photovoltaic panels. The time required for moving the vehicle—from one installation position to the next—is used by the robot 24 to pick up a new photovoltaic panel and bring it closer to the support structure S.

Figure 13:
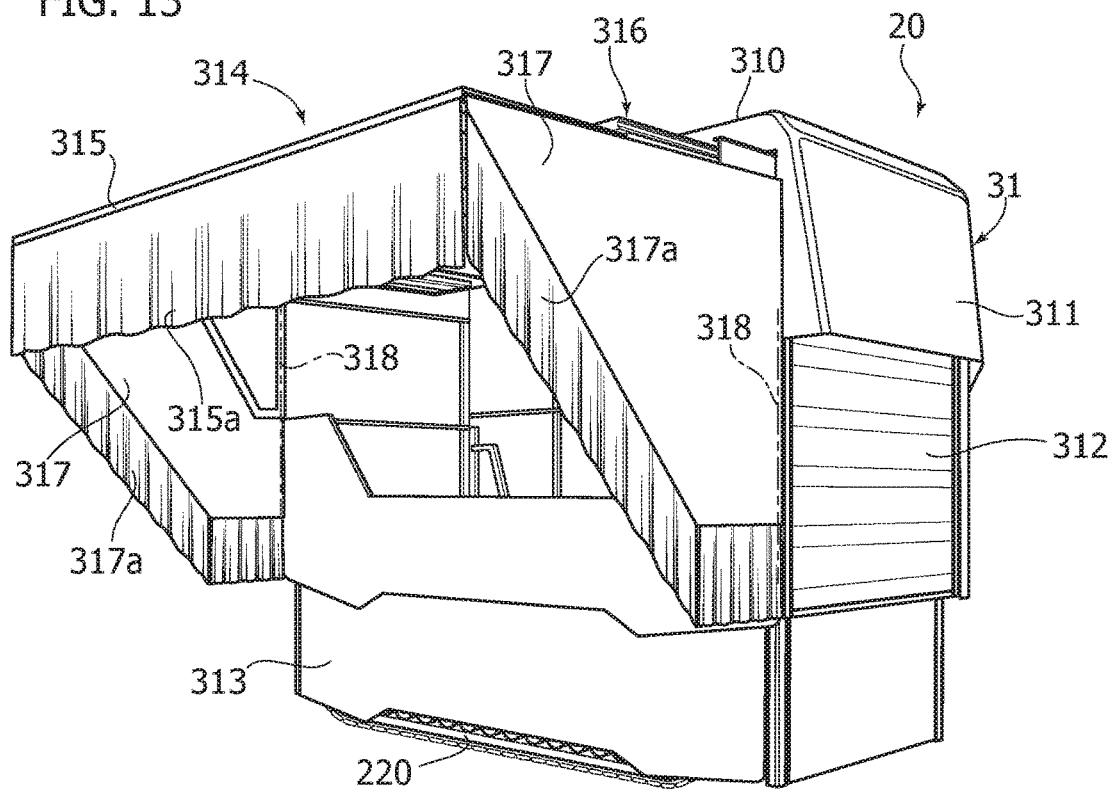
FIG. 13 is a perspective view of an alternate embodiment of the system according to the invention.

FIG. 13 illustrates another embodiment of the vehicle 20. In this case as well, the vehicle is preferably an autonomous vehicle. In the case of this embodiment, however, the vehicle is equipped with tracks 220, instead of wheels. As already indicated with reference to the embodiment of FIG. 6, the details relating to the frame of the vehicle 20, to the powering system with which this vehicle is provided, and to the transmission system which drives the tracks 220, are not illustrated here, since they can be made in any known way and also because such details, taken alone, do not fall within the scope of the present invention. In this case as well the vehicle 20 has a cover 31, which creates a protected chamber inside which the robot 24 is arranged, along with the containers 26 with the piles 25 of photovoltaic panels to be mounted, and the additional components 28-30 described above (not shown in FIG. 13). The cover 31 has a roof 310, two end walls 311 extending above vertical walls closed by roller shutters 312 and a rear wall (not visible in FIG. 13). On the front side of the chamber containing the robot 24, the side wall of the vehicle extends downwards until it partially covers the respective track 220, and extends upwards for only about half of the height of the vehicle, so as to leave free the space through which the robot can pass the photovoltaic panels to be positioned on the support structure arranged on the ground. The positioning area of the panels is protected by a portion 314 of the cover 31 which protrudes in an overhanging manner from the side of the vehicle. The cover portion 314 is displaceable between a non-protruding retracted condition and an extracted operating condition. In particular, the portion 314 includes a roof 315 having a front cross-member which is connected at its ends to two telescopic guides 316 (only one of which is visible in FIG. 13). Fluid or electric actuators (not shown) actuate the movement of the cross-member 315 between the extracted condition shown in FIG. 13, and a retracted condition, in which said cross-member is arranged adjacent to the side wall of the vehicle, with the telescopic guides 316 are retracted inside the cover 31. The cover portion 314 also comprises two side walls 317 which are supported, in an articulated manner, by the vehicle structure, about hinge axes 318. The front end portions of the upper edges of the two walls 317 are also guided within shaped guides (not illustrated), arranged in the roof of the covering portion 314, in such a way that the movement of the cross-member 315 between its retracted position and its extracted position causes a corresponding oscillation movement of the two side walls 317 between an inoperative position, in which said walls are rotated against the side of the vehicle, and an operative position (illustrated in FIG. 13) in which said walls protrude from the vehicle, in planes perpendicular to the plane of the corresponding side of the vehicle. Finally, both the cross-member 315 and the front edges of the two side walls 317 are equipped with a tent portion 315a, 317a to complete the isolation of the installation area of the photovoltaic panels.

Figure 14:
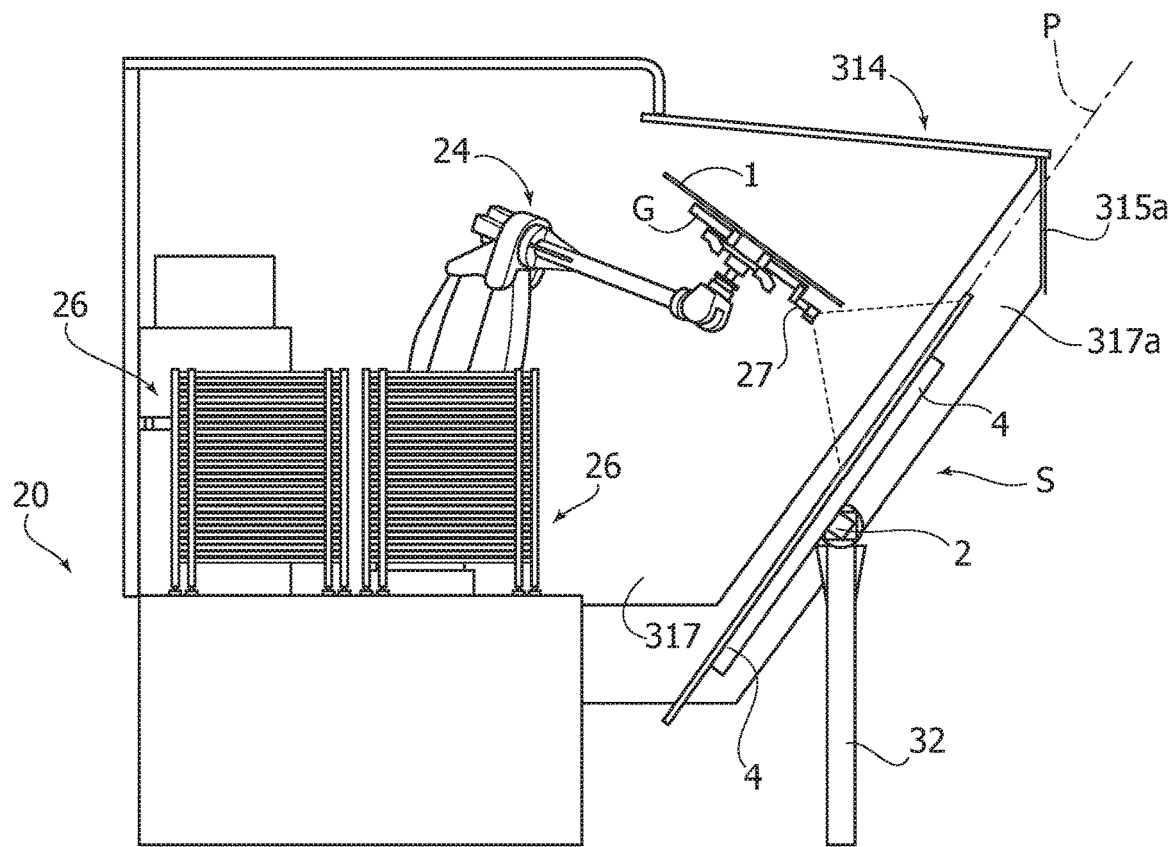
FIG. 14 is a cross-sectional view of the embodiment of FIG. 13 shown in use with an inclined support structure.

FIG. 14 is an additional illustration, in a cross-sectional view, of the vehicle, during the installation step of a photovoltaic panel. Unlike that illustrated in FIGS. 6, 10 and 11, the case of FIG. 14 is that in which the structure S—including the longitudinal beam 2 carrying the profiled bars 4—is oriented in such a way that the plane in which the photovoltaic panels 1 must being positioned is inclined with respect to the horizontal plane. In this case, the robot 24 positions each photovoltaic panel 1 with a movement in a direction perpendicular to the plane, indicated by P in FIG. 14, in which the panel 1 is located after the installation.

Figure 10:
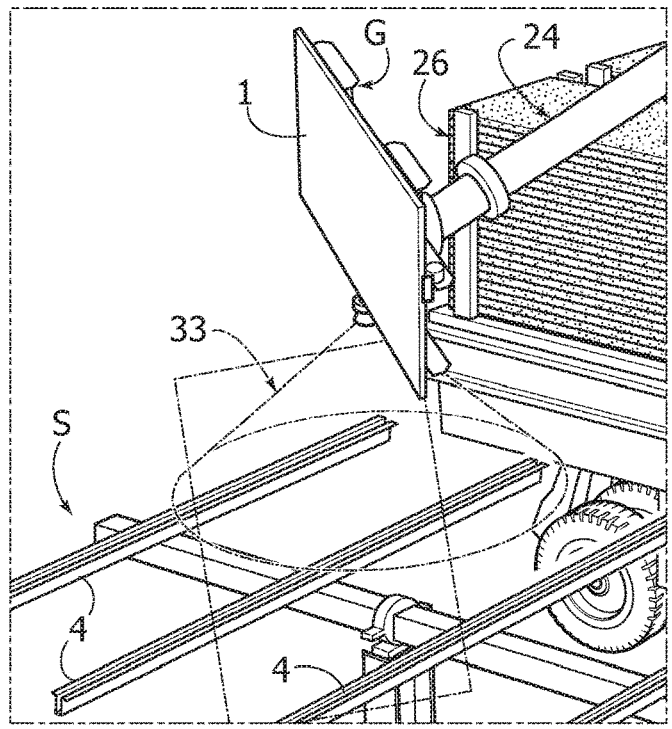
Figure 11:
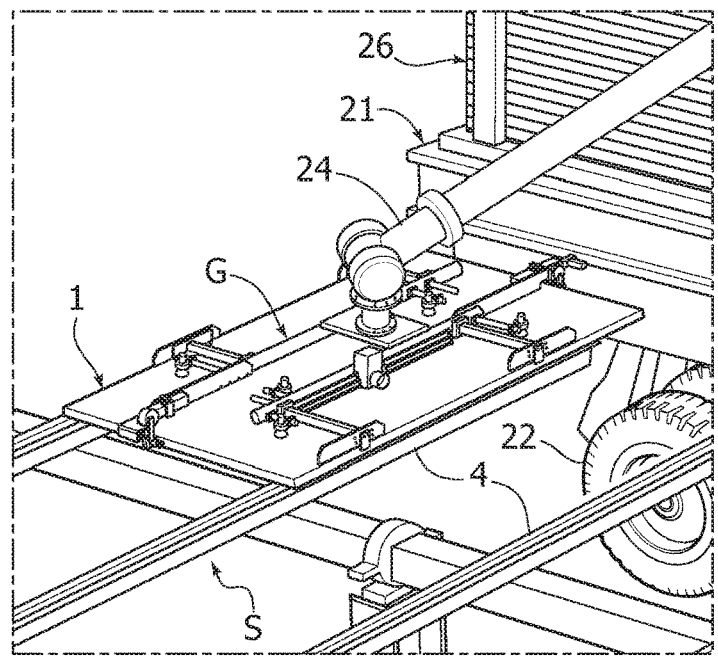

Similarly to that already been described with reference to FIG. 10, in this case as well, the robot 24 is controlled so as to orientate the gripper G with the video camera 27 looking at the installation area of the photovoltaic solar panel.

In this step, a problem arises of providing the electronic controller of the robot with precise coordinates of a plurality of points that correctly identify the installation position of the photovoltaic solar panel. This problem is not easy to solve, since the support structure S on which the photovoltaic solar panels are intended to be mounted has a certain degree of flexibility and tends to deform as it is gradually loaded with a row of photovoltaic solar panels. This causes a change in the position in which an area of the support structure designed to receive a panel 1 is located at the moment when the robot brings a panel close to this structure.

Figure 15:
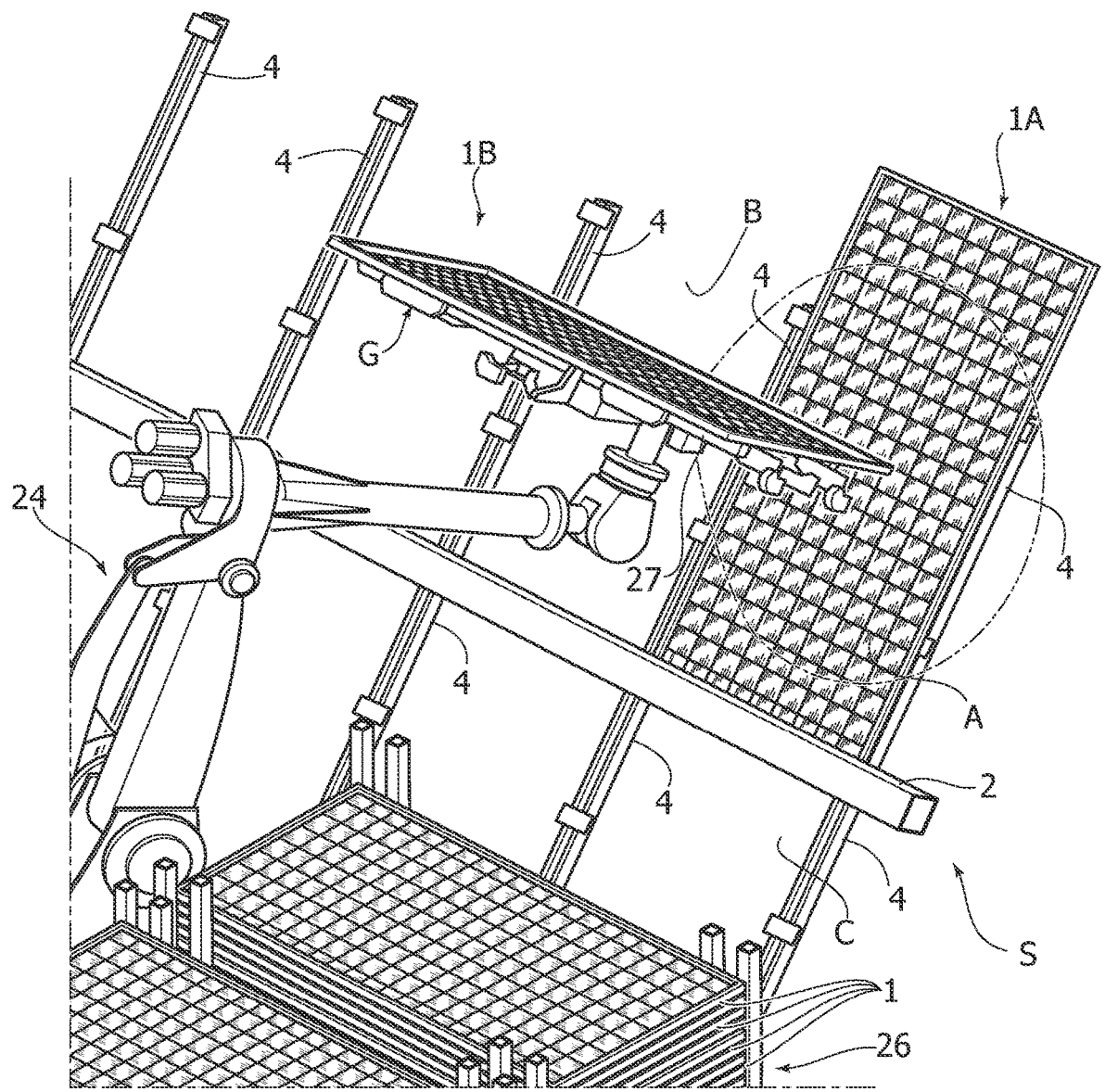
FIG. 15 is a perspective view of the embodiment shown in FIGS. 13 and 14 in use with one panel installed.

In order to solve this problem, according to a further characteristic of the present invention, the video camera 27 is connected to an electronic controller (which may be part of the electronic controller of the robot or constitute an autonomous electronic unit), which is programmed to calculate the correct position for installing each photovoltaic solar panel, on a predetermined area of the support structure S, on the basis of the optical detection of the position of another photovoltaic panel previously installed on the structure S (preferably the panel installed immediately before), adjacent to said predetermined area. This operation mode is further clarified in FIG. 15. This Figure shows the longitudinal beam 2 forming part of the stationary structure S, with the metal profiled bars 4 forming a plurality of cross-members protruding on opposite sides of the longitudinal beam 2. FIG. 15 shows the case in which a panel 1A has already been mounted in an area A of the structure S, defined between the longitudinal beam 2 and a pair of cross-members 4. FIG. 15 also illustrates the robot 24 carrying the gripper G that has gripped another panel 1B, which is to be installed in an area B adjacent to the area A. According to the invention, in order to provide the electronic controller with reference spatial coordinates for positioning the panel 1B in the area B, the optoelectronic system including the video camera 27 refers to the panel 1A which has been immediately mounted before, adjacent to the area B where the panel 1B is to be mounted. FIG. 15 shows that the robot 24 keeps the panel 1B in a position oriented orthogonally to the panel 1A, to allow the video camera 27 to view the area A (in which the panel 1A has been already installed). Based on the optical detection performed in the step illustrated in FIG. 15, the electronic controller performs a calculation of the correct installation position of the panel 1B in the area B adjacent to the area A. The same electronic controller exploits the optical detection performed in the step illustrated in FIG. 15 in order to calculate the reference coordinates for the correct positioning of another photovoltaic panel in the additional area C, indicated in FIG. 15, adjacent to the area A.

Alternatively, positioning of the panel can be performed with reference to a previously stored reference image.

Figure 16:
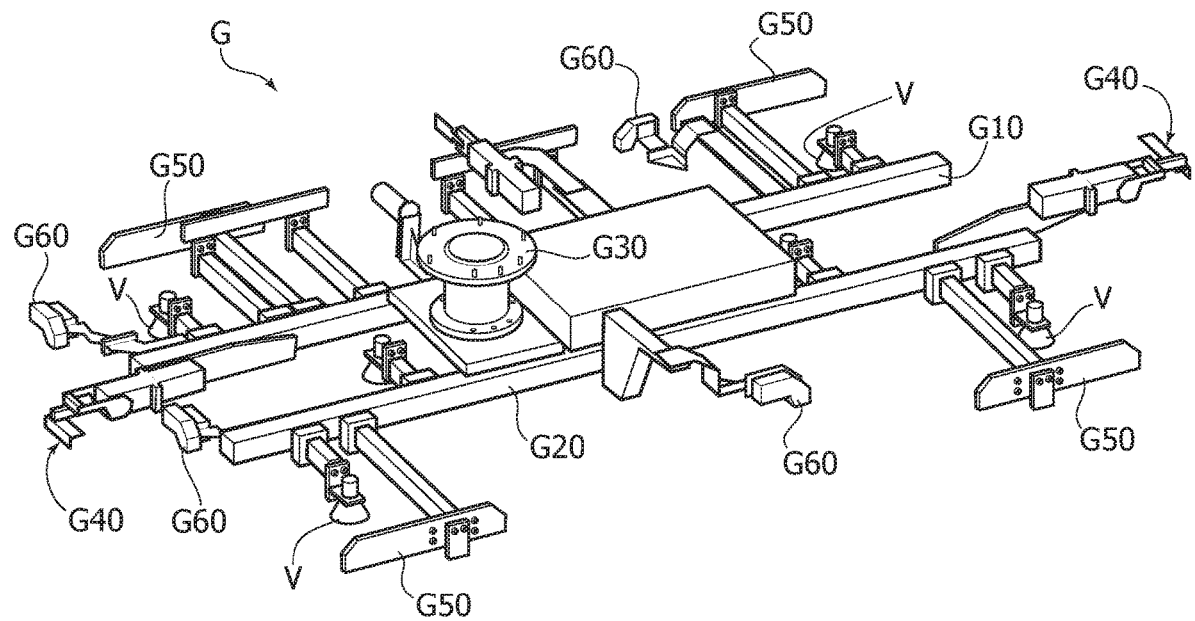
FIG. 16 is perspective view of an alternate gripper device.

FIG. 16 is an additional perspective view of the gripper G, according to a variant of FIG. 7. In the case of FIG. 16, in place of the video camera 27, the gripper G is equipped with four optoelectronic sensors G60 (in FIG. 16, the parts common to those of FIG. 7 are indicated with the same reference numbers). Each of the optoelectronic sensors G60 is of a type known per se, including a laser head configured to project a laser light blade onto an object to be optically detected, and an optical sensor-receiver. Optical detectors of this type are commercially available and allow optical detection of the position of an object through a triangulation process.

Figure 17:
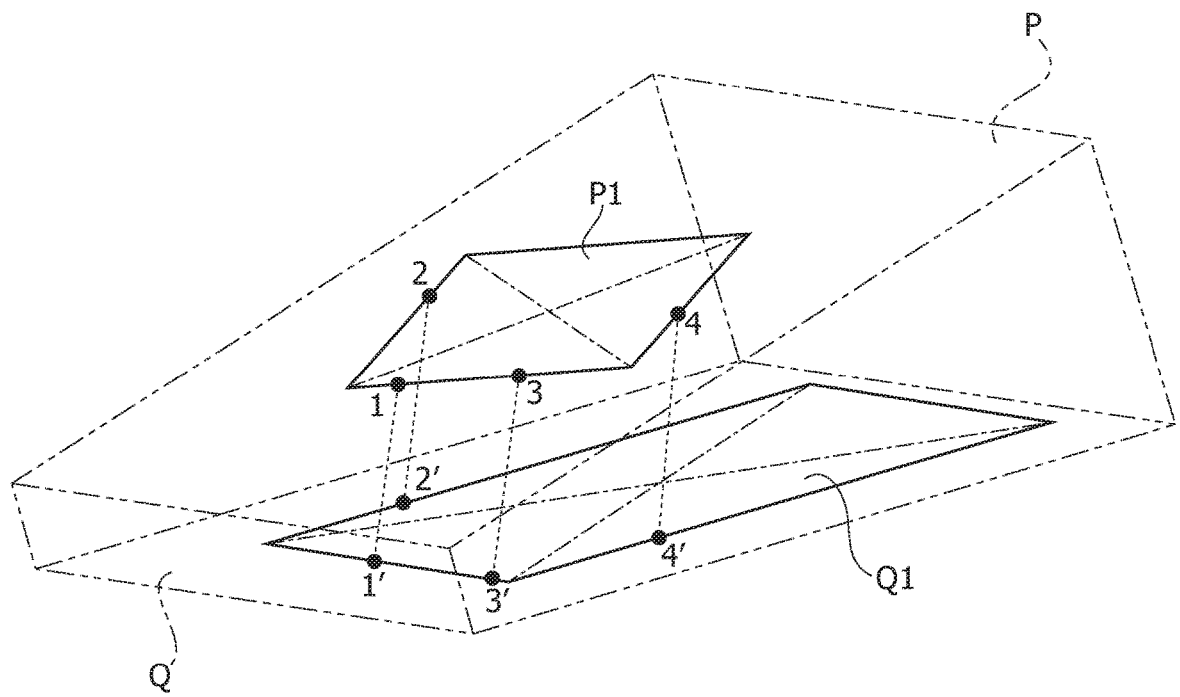
FIG. 17 is a schematic drawing showing an embodiment of aligning a panel with a correct assembly position.

With reference to FIG. 17, in the case of this optical detection system, during the positioning step of the panel, the system knows—at all times—what the position of the plane P is, which contains the panel P1 identified by four points 1, 2, 3, 4 belonging to the panel. At the same time, the optical detection system is able to detect the general plane Q, containing the area Q1 corresponding to the correct assembly position, identified by four points 1', 2', 3', 4'. When the panel P1 is installed correctly, points 1, 2, 3, 4 must coincide with points 1', 2', 3', 4'. Points 1, 2, 3, 4 associated with the plane P of the panel carried by the robot may correspond to the positions of the optoelectronic detectors G60. These devices are able to identify the position of the points 1', 2', 3', 4' on the installation plane of the panel and, at any moment, are able to calculate the relative position of points 1, 2, 3, 4 from points 1', 2', 3' and 4'. In this way, the electronic controller of the robot can calculate the movement to be imparted to the panel carried by the gripper G in order to obtain the positioning of the panel in the required final position.

Of course, without prejudice to the principle of the invention, the details of construction and the embodiments may vary widely with respect to those described and illustrated purely by way of example, without departing from the scope of the present invention, as defined by the attached claims.

For example, it is possible to envisage that several photovoltaic solar panels 1 can be carried by a common support frame, so as to allow simultaneous installation of these panels, together with their common frame, above the support structure.

What is claimed is:

1. A method for positioning a row of photovoltaic solar panels on a support structure arranged in an outdoor space,
   wherein a vehicle is provided, on which the photovoltaic solar panels to be positioned are arranged,
   wherein a manipulator robot is arranged on-board the vehicle, programmed to pick-up one or more photovoltaic solar panels from the vehicle and to position them on said support structure,
   said method being characterized in that:
   the vehicle moves on one side, and along, said support structure for positioning said row of photovoltaic solar panels in sequence, each photovoltaic solar panel being positioned by the manipulator robot on the support structure, with an approaching movement of the photovoltaic solar panel towards the support structure, in such a way that at the end of the movement each photovoltaic solar panel is already in a final position along said row of photovoltaic solar panels, wherein the vehicle further comprises a cover operable to protect the manipulator robot and the photovoltaic solar panels carried by the vehicle, the cover having a portion protruding at least on one side of the vehicle operable to define a protected chamber above a positioning area of each photovoltaic panel.

2. The method according to claim 1, wherein the vehicle comprises an autonomous vehicle.

3. The method according to claim 2, wherein the autonomous vehicle comprises an Automated Guided Vehicle (AGV) mounted on one of wheels or tracks.

4. The method according to claim 1, wherein the manipulator robot further comprises an opto-electronic system operable for automatic optical recognition of a correct position for picking-up one of the photovoltaic solar panels to be installed, and also of a correct position of each of the photovoltaic solar panels on the support structure.

5. The method according to claim 4, wherein the optoelectronic system comprises an electronic controller programmed to calculate the correct position of each photovoltaic solar panel on a predetermined area of the support structure, on the basis of an optical detection of a position of another photovoltaic panel which has been previously installed on the support structure adjacent to said predetermined area.

6. The system according to claim 1, wherein the cover has a portion movable between an extracted position, wherein it defines said protruding portion of the cover, and a position retracted within the vehicle structure.

7. The system according to claim 6, wherein the portion of said cover includes a roof slidably mounted between a retracted position in the vehicle and an extracted position projecting on one side of the vehicle, and two side walls pivotally mounted between an operative position in which they protrude transversely from the vehicle, and a rest position, in which they are rotated against a side wall of the vehicle.

8. A system for positioning a row of photovoltaic solar panels on a support structure arranged in an outdoor space, said system comprising:
   a vehicle, on which the photovoltaic solar panels to be positioned are arranged;
   a manipulator robot arranged on-board the vehicle operable to pick-up one or more of the photovoltaic solar panels from the vehicle and to position them on said support structure;
   a controller in communication with the manipulator robot, the controller programmed for picking-up and positioning said row of photovoltaic solar panels in succession by said manipulator robot while the vehicle gradually moves on one side, and along, said support structure, by causing each photovoltaic solar panel to have an approaching movement towards the support structure, in such a way that at the end of the movement, each photovoltaic solar panel is already in a final position along said row of photovoltaic solar panels; and
   the vehicle further comprises a cover operable to protect the manipulator robot and the photovoltaic solar panels carried by the vehicle, the cover having a portion protruding at least on one side of the vehicle operable to define a protected chamber above a positioning area of each photovoltaic solar panel.

9. The positioning system according to claim 8, wherein said manipulator robot comprises a gripping device.

10. The positioning system according to claim 9, wherein said gripping device comprises a plurality of suction cups.

11. The positioning system according to claim 8, wherein the vehicle comprises an autonomous vehicle.

12. The positioning system according to claim 11, wherein the autonomous vehicle comprises an Automated Guided Vehicle (AGV) mounted on one of wheels or tracks.

13. The positioning system according to claim 8, wherein the manipulator robot further comprises an optoelectronic system operable for automatic optical recognition of both a correct position for picking-up one of the photovoltaic solar panels to be installed, and of a correct position of each of the photovoltaic solar panels on the support structure.

14. The positioning system according to claim 13, wherein the optoelectronic system further comprises an electronic controller programmed to calculate the correct position for installing each photovoltaic solar panel on a predetermined area of the support structure, on the basis of an optical detection of a position of another photovoltaic panel, previously installed on the support structure adjacent to said predetermined area.

15. The positioning system according to claim 8, wherein the vehicle carries, in addition to the manipulator robot, at least one container carrying a plurality of the photovoltaic solar panels, and said electronic controller of the robot.

16. The positioning system according to claim 15 further comprising:
   an electric generator supported by the vehicle and driven by an engine of the vehicle, the electric generator is operable to at least one of supply electrical power to the manipulator robot or recharge electric supply batteries.

17. The positioning system according to claim 8, wherein the vehicle carries a source of pressurized air operable to activate one of pneumatic devices or suction devices carried by the robot, for gripping the solar photovoltaic panels.

18. The system according to claim 8, wherein said manipulator robot further comprises:
   a protective sheath, inside of which air can be blown at a controlled temperature.

19. The system according to claim 8, wherein the cover has a portion movable between an extracted position, wherein it defines said protruding portion of the cover, and a position retracted within the vehicle structure.

20. The system according to claim 19, wherein the portion of said cover includes a roof slidably mounted between a retracted position in the vehicle and an extracted position projecting on one side of the vehicle, and two side walls pivotally mounted between an operative position in which they protrude transversely from the vehicle, and a rest position, in which they are rotated against a side wall of the vehicle.

\* \* \* \* \*